United States Patent [19]

Bluzer et al.

[11] Patent Number: 5,606,187
[45] Date of Patent: Feb. 25, 1997

[54] CHARGE COUPLED DEVICE GATE STRUCTURE HAVING NARROW EFFECTIVE GAPS BETWEEN GATE ELECTRODES

[75] Inventors: Nathan Bluzer, Rockville; James Halvis, Severna Park, both of Md.

[73] Assignee: Northrop Grumman Corporation, Los Angeles, Calif.

[21] Appl. No.: 491,666

[22] Filed: Jun. 19, 1995

[51] Int. Cl.$^6$ .................................................. H01L 27/148
[52] U.S. Cl. .................... 257/232; 257/249; 257/250; 257/295; 257/310; 257/448
[58] Field of Search ........................... 257/222, 232, 257/234, 249, 250, 295, 310, 448, 457, 459, 752

[56] References Cited

U.S. PATENT DOCUMENTS 5,442,207  8/1995  Jeong .................................. 257/249

Primary Examiner—Minh Loan Tran
Attorney, Agent, or Firm—Walter G. Sutcliff

[57] ABSTRACT

A CCD structure including high resolution pixels. The gate electrodes of the CCD are separated by gaps in the order of 0.6 μm which are made to look smaller than their physical size by the use of dielectric filler material in the gaps. The dielectric filler material has a relatively high dielectric constant which is relatively large for the clock frequencies utilized but may be relatively low for optical frequencies. The dielectric constant of the dielectric filler material is typically greater than 20 and is selected from materials such as tantalum oxide, zirconium oxide, barium titanate and barium strontium titanate.

11 Claims, 2 Drawing Sheets

CHARGE COUPLED DEVICE GATE STRUCTURE HAVING NARROW EFFECTIVE GAPS BETWEEN GATE ELECTRODES

BACKGROUND OF THE INVENTION

1. Field of the Invention

This invention relates to charge coupled devices using single level gates.

2. Description of the Prior Art

Charge coupled devices are generally known and comprise one form of charge transfer device which uses moving potential wells to translate, that is, shift analog charge packets from an input end to an output end of a semiconductor body. The potential wells move in response to changes in potential applied to a series of electrodes or gates formed on an insulating layer applied to the surface of the semiconductor body. Such devices are disclosed in numerous prior art publications and patents, a typical example being U.S. Pat. No. 4,032,952, entitled, "Bulk Charge Transfer Semiconductor Device", issued to S. Ohba et al on Jun. 28, 1977.

From the beginning, the fabrication of charge coupled devices (CCD) has undergone a great deal of development and improvement in performance, with a constant effort being directed to the realization of CCDs with very small pixels for providing high resolution, high quantum efficiency so as to provide increased sensitivity, low noise, and the same clocking voltages for different CCD phases.

The most direct approach is to utilize single level gates with relatively narrow gaps therebetween; however, if the gaps become too wide, the CCD clocking voltages need to be increased in amplitude to compensate for the potential wells or barriers caused by the gaps. Such potential wells or barriers cause loss of CCD transfer efficiency by trapping charge, since the fringing effects of the CCD clocking gates are attenuated with larger gaps.

Typically, the gaps between gates are formed during the CCD gate definition process; however, as the gaps between the gates become increasingly smaller, i.e. in the order of 0.35 μm, defining such narrow gaps becomes increasingly difficult because of resolution limits and projection aligners and limitations in the etching of very narrow gaps. The advances in silicon based devices have been significant in both the resolution of projection aligners and the etching of fine lines and spaces; however, where there is a need to fabricate a CCD with pixels having a dimension typically 6 μm×6 μm with two or more gates per pixel, it necessitates fabricating narrow CCD gates having a width in the order of 2.65 μm and gaps in the order of 0.35 μm while still achieving a high yield. To date, this task presents formidable problems to the fabricator.

SUMMARY

Accordingly, it is an object of the present invention to provide an improvement in charge coupled devices.

It is another object of the invention to provide an improvement in imaging type charge coupled devices.

It is yet another object of the invention to provide a CCD with extremely small pixels utilizing a scheme for ameliorating the size of the narrow gaps between gates while improving yield and simplifying the CCD fabrication process.

Briefly, the foregoing objects and advantages of the present invention are realized by a charge coupled device and its method of fabrication including: a semiconductor substrate having a surface region including a buried channel for translating charge carriers, a layer of dielectric material located on the substrate adjacent the surface region including the buried channel, a plurality of gate electrodes of predetermined width located on an outer surface of the layer of dielectric material and being respectively separated by spacings or gaps providing a predetermined separation distance between adjacent gate electrodes, and means comprising a dielectric filler material having a relatively high dielectric constant located in the gaps for electrically reducing the effective separation distance between the gate electrodes.

The method of fabrication involves the steps of: forming a layer of dielectric material over a silicon substrate, forming pixels having a plurality of gate electrodes, or simply gates, on the layer of dielectric material, with the gates having gaps therebetween of a predetermined width, and filling in the gaps between the transparent gates with dielectric material having a predetermined dielectric constant thereby making the gap behave as if it were smaller than its actual physical size. This acts to enhance performance of the device while easing the problem of defining and forming the gates.

BRIEF DESCRIPTION OF THE DRAWINGS

The following detailed description of the invention will be more readily understood when considered together with the accompanying drawings in which.

DETAILED DESCRIPTION OF THE INVENTION

Figure 1:
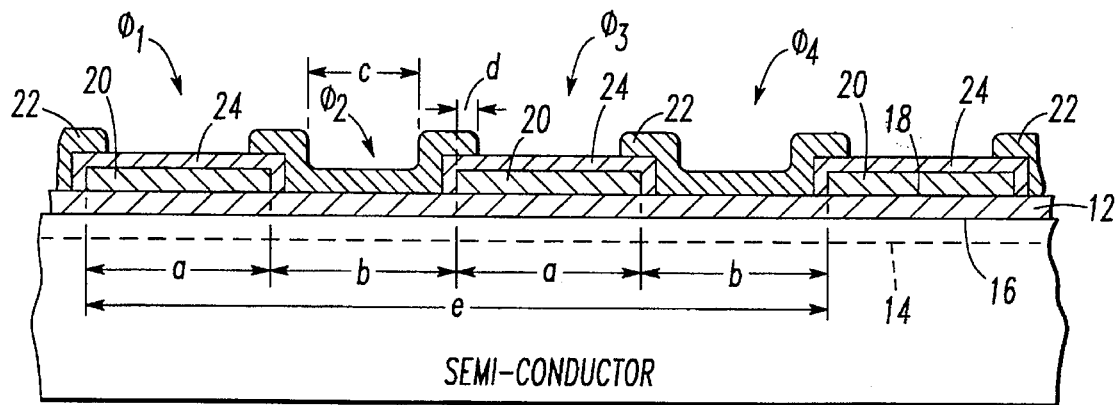
FIG. 1 is a partial longitudinal cross section of a conventional CCD device having a two level overlapping gate structure.

Referring now to the drawings wherein like reference numerals refer to like components throughout, and more particularly to FIG. 1, shown thereat is a conventional charge coupled device (CCD) including a four-phase $\phi_1$, $\phi_2$, $\phi_3$ and $\phi_4$, two level overlapping gate structure. As shown, reference numeral 10 denotes a semiconductor substrate comprised, for example, of silicon (Si) over which is formed an insulating layer 12 of dielectric material comprised, for example, of oxidized silicon. This is not meant to be considered in a limiting sense, since it is well known to incorporate CCDs in other types of semiconductor material, such as mercury cadmium telluride and gallium arsenide.

The electric charge carriers in the CCD may be photo generated in the substrate upon illumination by an optical source. Also, although not shown, one end of the substrate 10 may include means for introducing electric charge carriers. These charge carriers will move in potential wells in a buried channel region 14 of the semiconductor substrate adjacent the surface 16 contiguous with the layer of dielectric material 12. The amount of charge carriers is detected by a read out structure, not shown. As is well known, the electric charge carriers are moved as packets of carriers located in potential wells which are shifted in response to changes in the potential applied to a series of gate electrodes formed on the top surface 18 of the dielectric layer 12.

As shown in FIG. 1, first level gates are shown comprising a plurality of generally flat coplanar gate electrodes 20 having a width "a" separated by a distance "b". Between the electrodes 20 are formed a plurality of second level overlapping gate electrodes 22. The gate electrodes 20 and 22 are electrically separated by a thin layer of insulation 24. When synchronized and properly phased clock voltages are applied to the gate electrodes 20 and 22, charge transfer will take place from an input to an output. A conventional four phase overlapping gate structure as shown in FIG. 1 typically has the following dimensions: a≈5 μm; b≈5 μm; c≈4.3 μm; d=1 μm and e=20 μm.

Figure 2:
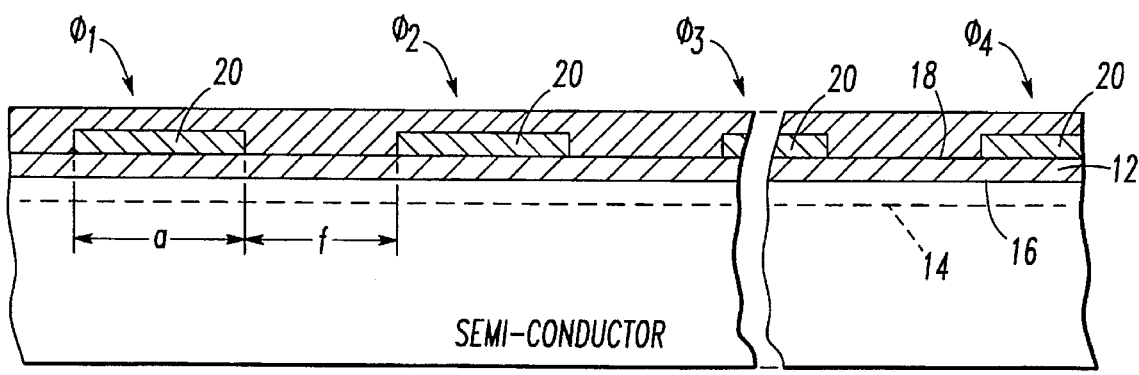
FIG. 2 is a partial longitudinal cross section of a conventional CCD device having a single level gate structure.

Referring now to FIG. 2, a known prior art single level gate structure is shown thereat, which again is comprised of a semiconductor substrate 10, a dielectric layer 12 deposited on the top surface 16 of the substrate. In this configuration, a single layer of coplanar gates 20 utilizing a four phase $\phi_1$, $\phi_2$, $\phi_3$, $\phi_4$ clock scheme are formed on the top surface 18 of the dielectric layer 12. A top layer of regular dielectric material 24, e.g. $SiO_2$, is shown covering the structure of FIG. 2. The single level gate structure of FIG. 2 generally corresponds in gate size to the CCD structure shown in FIG. 1 where, for example, a≈5 μm and f≈3 μm.

This now leads to a consideration of the subject invention where there is a need to fabricate an imaging type CCD structure including pixels having an extremely small size, e.g. 6 μm×6 μm. Such a device requires definition of very small lines and spaces for the gate electrodes.

If 6 μm×6 μm pixel is required for use with a four phase CCD clock system as shown in FIG. 1, and one having a width e=6 μm, the gate electrodes 20 typically need to have a width dimension of a≈1.5 μm. Also the following dimensions would have to be implemented: b≈1.5 μm and d≈0.6 μm, leaving c≈0.3 μm.

Technically, it is extremely difficult to fabricate dimensions in the order of 0.3 μm and obtain significant yield because of resolution limits and projection aligners and the limitations in the etching of very narrow gaps, particularly where, for example, a 400×500 element sensor is required. In such a structure, the linear intergate distance becomes very large, i.e. in the order of 240 cm. On the other hand, if a single level gate structure such as shown in FIG. 2 were to be utilized for a 6 μm×6 μm pixel, the gates 20 would require a width of a≈1.15 μm with a gap spacing f=0.35 μm. As noted above, defining a gap width of 0.35 μm is difficult to achieve if a high yield is required. It immediately becomes obvious that fabricating a device with 0.35 μm gaps which are 240 cm long, is not an easy task. It would be extremely desirable if a wider gap, for example, on the order of 0.6–0.8 μm could be used, since this would ease the fabrication problems significantly.

Figure 3:
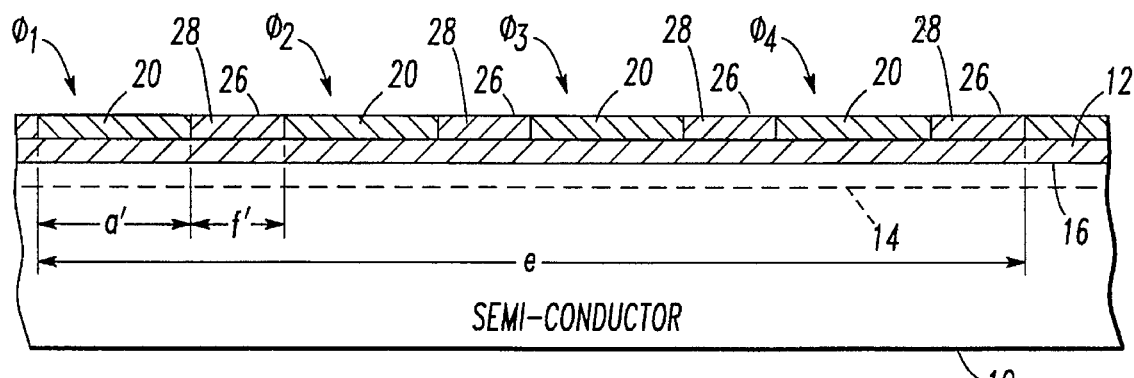
FIG. 3 is a partial longitudinal cross section of the preferred embodiment of the subject invention.

Accordingly, in the preferred embodiment of the invention shown in FIG. 3, a single level four phase gate structure is disclosed where e≈6 μm and one including a set of gate electrodes 20 having a width dimension a'≈0.9 μm which are separated by gaps 26 having a dimension f'≈0.6 μm. For a two phase gate structure, the width dimension a' of the gate electrodes 20 would be in the order of 2.4 μm, i.e. a'≈2.4 μm. This is readily obtainable by current state of the art lithographic techniques. As before, these elements are fabricated on a semiconductor substrate 10 and an insulating layer 12.

The present invention now employs means to electrically make gaps 26, ranging between 0.35 μm and 0.8 μm, look smaller than their physical size, i.e. to make 0.6 μm gaps, for example, effectively look as though they are on the order of 0.35 μm or less and, accordingly, overcome the undesired effects of relatively large gap widths.

This is achieved by filling the gaps 26 with dielectric filler material shown by reference numeral 28. The dielectric filler material makes the effective gaps smaller by, approximately, the ratio to the dielectric constant of air. Accordingly, the dielectric filler material has a relatively high dielectric constant (e>20) which is relatively large for clock frequencies. However, this dielectric filler material may exhibit a relatively smaller dielectric constant at optical frequencies. Examples of desired dielectric material include: tantalum oxide, zirconium oxide, barium titanate and barium strontium titanate.

Figure 4:
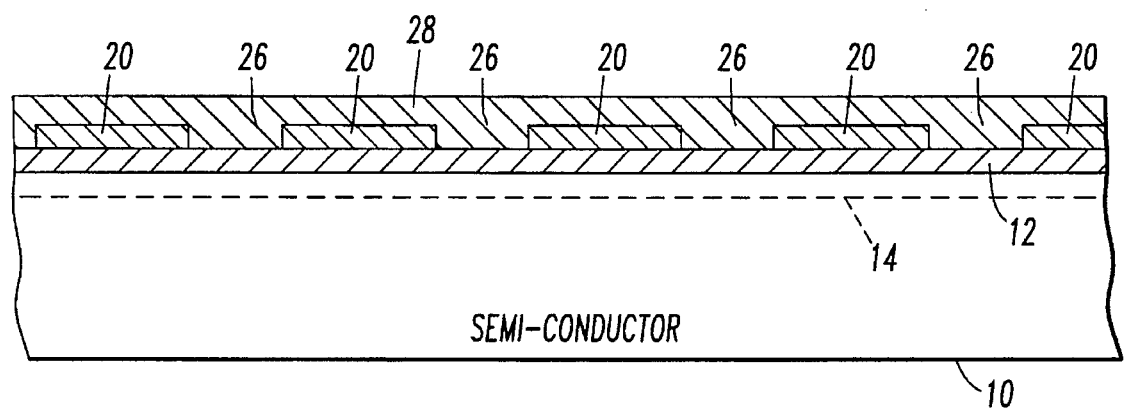
FIG. 4 is a partial longitudinal cross section of a modification of the embodiment shown in FIG. 3.

It should be noted that the thicker the gates 20 are, the more effective will be the dielectric filler material 28. In the embodiment shown in FIG. 3, the dielectric filler material 28 is limited to the area between the CCD gates 20; however, as shown in FIG. 4, the dielectric filler material is deposited over the complete gate structure as well as within the gaps 26. The benefit of the dielectric filler material 28 will be equivalent in both instances. The embodiment shown in FIG. 4 comprises a structure which may in some instances be more easily fabricated. An optional approach would also be to thin the dielectric layer 12 at the location of the gaps 26 prior to the deposition of the dielectric filler material 28.

Accordingly, what has been shown and described is a scheme whereby relatively wider physical gaps between CCD gate electrodes are made to appear electrically smaller than their actual physical size and thus the relatively larger physical integrate gap behaves as an effectively smaller gap. For a 400×500 element CCD sensor comprised of 6 μm×6 μm pixels, this results in an increase in pixel yield as well as easing the fabrication problems associated with producing pixels in a CCD structure of the size contemplated.

Having thus shown and described what is at present considered to be the preferred method and embodiments of the subject invention, it should be noted that the same has been made by way of illustration and not limitation. Accordingly, all modifications, alterations and changes coming within the spirit and scope of the invention as set forth in the appended claims are herein meant to be included.

We claim:

1. A charge coupled device, comprising:

a semiconductor substrate having a surface region including a buried channel for translating charge carriers;

a layer of dielectric material located on said substrate adjacent to said surface region;

a plurality of gate electrodes of predetermined width located on an outer surface of said layer of dielectric material and being respectively separated by interelectrode gaps providing a predetermined separation distance between adjacent gate electrodes; and dielectric filler means located in said gaps for reducing the effective electrical separation distance between said plurality of gate electrodes relative to the actual physical separation distance, said means comprising dielectric filler material having a relatively high dielectric constant for clock frequency signals applied to said gate electrodes and a relatively low dielectric constant for optical frequency signals impinging on the device.

2. A charge coupled device in accordance with claim 1 wherein said dielectric filler material has a dielectric constant greater than 20.

3. A charge coupled device in accordance with claim 1 wherein said dielectric filler material is a material selected from the group consisting of tantalum oxide, zirconium oxide, barium titanate, and barium strontium titanate.

4. A charge coupled device in accordance with claim 1 wherein said plurality of gate electrodes are arranged on a single level.

5. A charge coupled device in accordance with claim 4 wherein a set of said gate electrodes defines a pixel having a dimension of about 6×6 μm, wherein each of said gate electrodes has a width ranging between about 0.9 μm, for a four phase gate structure, to about 2.4 μm, for a two phase gate structure, and including a separation distance between gate electrodes of about 0.6 μm, said dielectric filler material effectively reducing the electrical separation distance between adjacent gate electrodes to a width of about 0.35 μm.

6. A charge coupled device in accordance with claim 5 wherein said dielectric filler material is a material selected from the group consisting of tantalum oxide, zirconium oxide, barium titanate, and barium strontium titanate.

7. A charge coupled device in accordance with claim 1 wherein said physical separation distance between said gate electrodes ranges between 0.35 μm and 0.8 μm.

8. A charge coupled device in accordance with claim 1 wherein said physical separation distance is about 0.6 μm whereby an effective electrical separation distance of about 0.35 μm is generated by said dielectric filler material.

9. A charge coupled device in accordance with claim 1 wherein said semiconductor substrate is comprised of silicon.

10. A charge coupled device, comprising:

a semiconductor substrate having a surface region including a buried channel for translating charge carriers;

a layer of dielectric material located on said substrate adjacent to said surface region;

a plurality of gate electrodes of predetermined width located on an outer surface of said layer of dielectric material and being respectively separated by inter-electrode gaps providing a predetermined separation distance between adjacent gate electrodes; and dielectric filler material having a dielectric constant greater than 20 located in said gaps for reducing the effective electrical separation distance between said plurality of gate electrodes relative to the actual physical separation distance.

11. A charge coupled device, comprising:

a semiconductor substrate having a surface region including a buried channel for translating charge carriers;

a layer of dielectric material located on said substrate adjacent to said surface region;

a plurality of gate electrodes of predetermined width located on an outer surface of said layer of dielectric material and being respectively separated by inter-electrode gaps providing a predetermined separation distance between adjacent gate electrodes; and dielectric filler material having a relatively high dielectric constant located in said gaps for reducing the effective electrical separation distance between said plurality of gate electrodes relative to the actual physical separation distance, said filler material being selected from the group consisting of tantalum oxide, zirconium oxide, barium titanate and barium strontium titanate.

\* \* \* \* \*